United States Patent
Dainese et al.

(10) Patent No.: US 10,276,708 B2
(45) Date of Patent: Apr. 30, 2019

(54) REVERSE-BLOCKING IGBT HAVING A REVERSE-BLOCKING EDGE TERMINATION STRUCTURE

(71) Applicant: Infineon Technologies Austria AG, Villach (AT)

(72) Inventors: Matteo Dainese, Villach (AT); Fabio Brucchi, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/635,433

(22) Filed: Jun. 28, 2017

(65) Prior Publication Data

US 2018/0033627 A1  Feb. 1, 2018

Related U.S. Application Data

(62) Division of application No. 15/223,834, filed on Jul. 29, 2016, now Pat. No. 9,741,570.

(51) Int. Cl.
*H01L 29/76* (2006.01)
*H01L 29/78* (2006.01)
(Continued)

(52) U.S. Cl.
CPC ...... *H01L 29/7811* (2013.01); *H01L 21/2255* (2013.01); *H01L 21/2256* (2013.01);
(Continued)

(58) Field of Classification Search
CPC ............ H01L 21/2257; H01L 29/0638; H01L 29/7395; H01L 29/0619; H01L 21/76224;
(Continued)

(56) References Cited

U.S. PATENT DOCUMENTS

| 5,440,164 A | 8/1995 | Finney et al. |
| 6,091,086 A * | 7/2000 | Zommer ............ H01L 29/7802 257/121 |

(Continued)

FOREIGN PATENT DOCUMENTS

DE  102004060210 A1  6/2006

OTHER PUBLICATIONS

Caprioli, Massimo, "True Reverse Blocking IGBT Higher Performance in A-NPC configuration", Fuji Electric Europe, Semiconductors Italy, Power Road Show 2013, pp. 1-29.
(Continued)

*Primary Examiner* — Shouxiang Hu
(74) *Attorney, Agent, or Firm* — Murphy, Bilak & Homiller, PLLC

(57) ABSTRACT

A reverse-blocking IGBT (insulated gate bipolar transistor) includes a plurality of IGBT cells disposed in a device region of a semiconductor substrate, a reverse-blocking edge termination structure disposed in a periphery region of the semiconductor substrate which surrounds the device region, one or more trenches formed in the periphery region between the reverse-blocking edge termination structure and an edge face of the semiconductor substrate, a p-type dopant source at least partly filling the one or more trenches, and a continuous p-type doped region disposed in the periphery region and formed from p-type dopants out-diffused from the p-type dopant source. The continuous p-type doped region extends from a top surface of the semiconductor substrate to a bottom surface of the semiconductor substrate.

14 Claims, 22 Drawing Sheets

(51) Int. Cl.
  *H01L 29/06* (2006.01)
  *H01L 21/225* (2006.01)
  *H01L 21/761* (2006.01)
  *H01L 21/762* (2006.01)
  *H01L 29/66* (2006.01)
  *H01L 29/739* (2006.01)

(52) U.S. Cl.
  CPC ........ *H01L 21/2257* (2013.01); *H01L 21/761* (2013.01); *H01L 21/76205* (2013.01); *H01L 21/76224* (2013.01); *H01L 21/76237* (2013.01); *H01L 29/0619* (2013.01); *H01L 29/0638* (2013.01); *H01L 29/0661* (2013.01); *H01L 29/0696* (2013.01); *H01L 29/6634* (2013.01); *H01L 29/7395* (2013.01); *H01L 29/66333* (2013.01)

(58) Field of Classification Search
  CPC ............ H01L 21/2255; H01L 29/6634; H01L 21/761; H01L 21/76205; H01L 21/76237; H01L 21/2256; H01L 29/66333; H01L 29/7811; H01L 29/0696; H01L 29/0661
  See application file for complete search history.

(56) References Cited

U.S. PATENT DOCUMENTS

| | | | |
|---|---|---|---|
| 6,727,527 B1 | 4/2004 | Zommer | |
| 7,049,674 B2 | 5/2006 | Nemoto et al. | |
| 7,157,785 B2 | 1/2007 | Takei et al. | |
| 7,307,330 B2 | 12/2007 | Nemoto et al. | |
| 7,572,683 B2 | 8/2009 | Takei et al. | |
| 7,638,368 B2 | 12/2009 | Nemoto et al. | |
| 8,080,858 B2 * | 12/2011 | Hider | H01L 29/0623 257/487 |
| 8,399,309 B2 | 3/2013 | Ogino et al. | |
| 8,558,308 B1 | 10/2013 | Blank et al. | |
| 8,558,342 B2 | 10/2013 | Yoshikawa et al. | |
| 9,293,527 B1 * | 3/2016 | Hsieh | H01L 29/0634 |
| 9,324,784 B2 * | 4/2016 | Roig Guitart | H01L 29/36 |
| 9,343,528 B2 | 5/2016 | Roig Guitart et al. | |
| 9,391,135 B1 | 7/2016 | Grivna et al. | |

OTHER PUBLICATIONS

Friedli, T. et al., "A High Efficiency Indirect Matrix Converter Utilizing RB-IGBTs", IEEE Annual Power Electronics Specialists Conference, Jul. 2006, pp. 1-7.

Lindemann, A., "A New IGBT with Reverse Blocking Capability", Entwurf fuer EPE Conference, European Conference on Power Electronics and Applications, Graz, Austria, 2001, Posted to Internet on Sep. 11, 2014, pp. 1-7.

Motto, E. R. et al., "Application Characteristics of an Experimental RB-IGBT (Reverse Blocking IGBT) Module", Conference Record of the 2004 IEEE Industry Applications Conference, 2004, 39th IAS Annual Meeting, vol. 3, pp. 1-5.

* cited by examiner

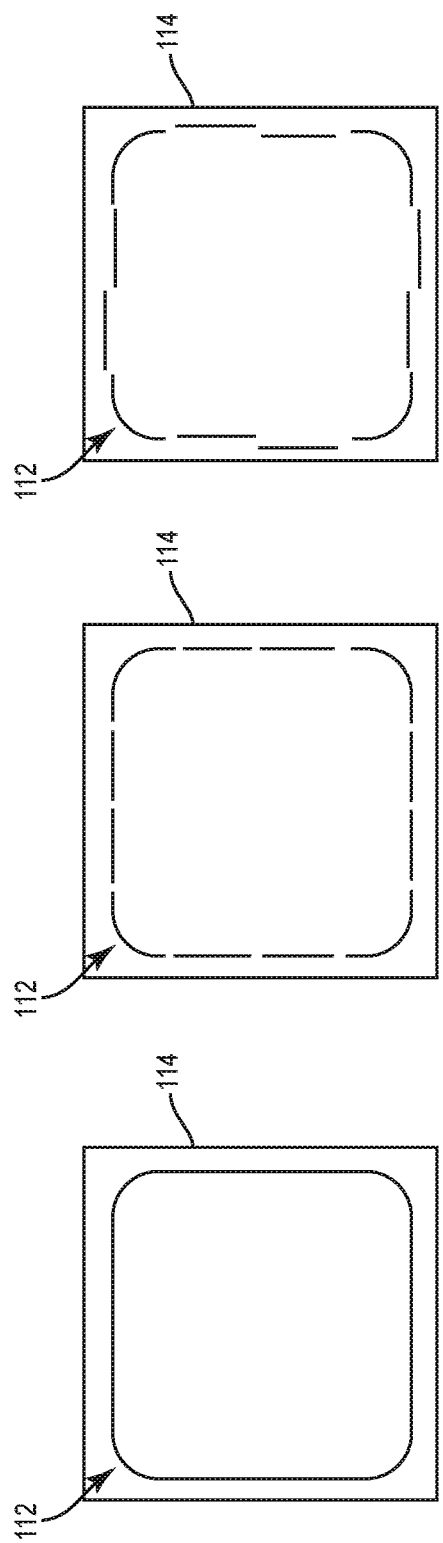

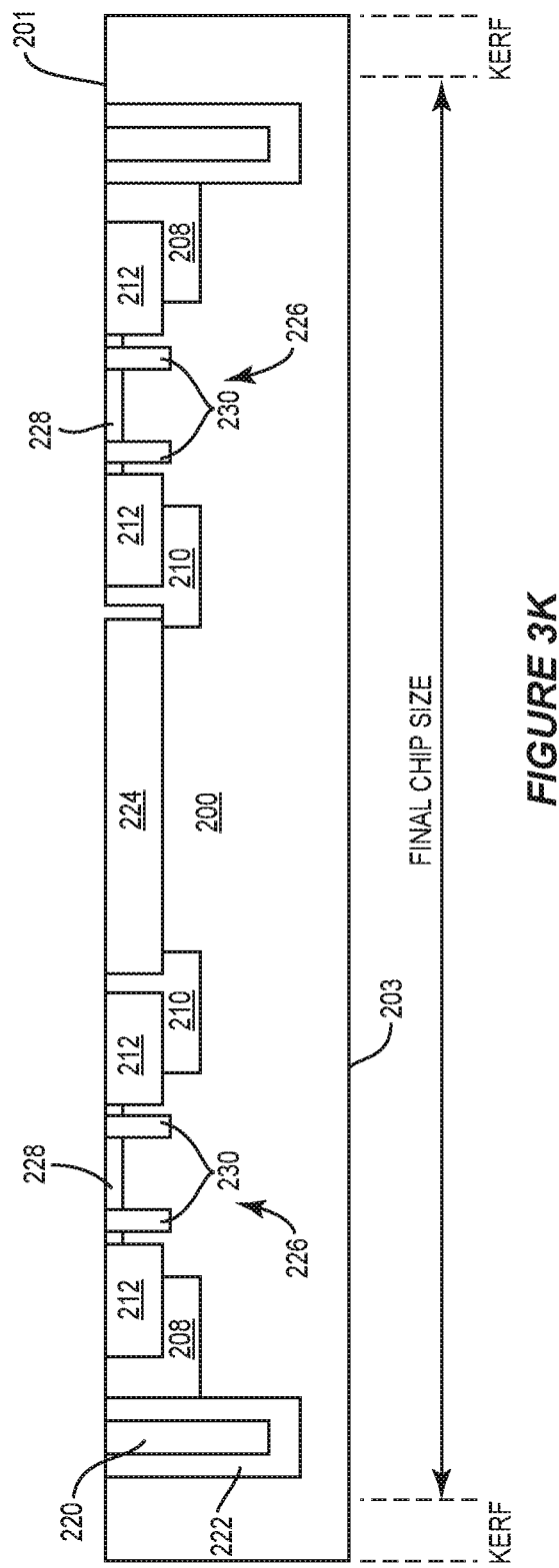

REVERSE-BLOCKING IGBT HAVING A REVERSE-BLOCKING EDGE TERMINATION STRUCTURE

TECHNICAL FIELD

The instant application relates to reverse-blocking IGBTs, and more particularly to reverse-blocking IGBTs with reduced chip area.

BACKGROUND

A reverse-blocking IGBT (insulated gate bipolar transistor) can be realized by adding minor changes to the structure of a standard IGBT so as to render the device capable of withstanding reverse voltage. Reverse-blocking capability is needed in various applications, such as current source inverters, resonant circuits, bidirectional switches, matrix converters, etc.

What differentiates a reverse-blocking IGBT from a forward-only blocking IGBT is that the p-n junction at the die backside is protected from the diced edges of the die by a p-type region. The p-type region is conventionally formed by a very deep dopant diffusion process around the perimeter of the die (chip). The deeply diffused region encircles the die perimeter and occupies the full thickness of the die. In the reverse-blocking condition, the backside p-n junction stops the current. When the backside p-n junction is reverse biased, equipotential lines in the space charge region fail to reach the diced edges of the die and therefore induce no leakage along the unprotected diced edges. The collector potential can be transferred to a reverse blocking termination at the opposite surface of the die directly by the p-type region across the entire depth of the die.

Forming a p-type region around the perimeter of a reverse-blocking IGBT and across the entire thickness of the die proves difficult via conventional deep dopant diffusion processes. A diffusing species such as Aluminum which has fast diffusion in semiconductor materials such as Silicon do not have high active doping levels. Moreover, a high thermal budget is required, further limiting the integration options. Also, significant lateral area of the die is consumed by the deep dopant diffusion process, which increases the die size and can be only partially offset by beginning the diffusion process in the kerf area i.e. the region of a semiconductor wafer that is cut e.g. by a saw blade or laser so as to singulate (physically separate) semiconductor dies from one another.

SUMMARY

According to an embodiment of a method of manufacturing a reverse-blocking IGBT (insulated gate bipolar transistor), the method comprises: forming a plurality of IGBT cells in a device region of a semiconductor substrate; forming a reverse-blocking edge termination structure in a periphery region of the semiconductor substrate which surrounds the device region; etching one or more trenches in the periphery region between the reverse-blocking edge termination structure and a kerf region of the semiconductor substrate; depositing a p-type dopant source which at least partly fills the one or more trenches; and diffusing p-type dopants from the p-type dopant source into semiconductor material surrounding the one or more trenches, so as to form a continuous p-type doped region in the periphery region which extends from a top surface of the semiconductor substrate to a bottom surface of the semiconductor substrate after thinning of the semiconductor substrate at the bottom surface.

According to an embodiment of a reverse-blocking IGBT (insulated gate bipolar transistor), the reverse-blocking IGBT comprises a plurality of IGBT cells disposed in a device region of a semiconductor substrate, a reverse-blocking edge termination structure disposed in a periphery region of the semiconductor substrate which surrounds the device region, one or more trenches formed in the periphery region between the reverse-blocking edge termination structure and an edge face of the semiconductor substrate, a p-type dopant source at least partly filling the one or more trenches, and a continuous p-type doped region disposed in the periphery region and formed from p-type dopants out-diffused from the p-type dopant source. The continuous p-type doped region extends from a top surface of the semiconductor substrate to a bottom surface of the semiconductor substrate.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 2A through 2C illustrate respective top plan views of different embodiments of the trench frame.

DETAILED DESCRIPTION

The embodiments described herein provide an integration scheme for realizing a reverse-blocking IGBT having a very deep dopant diffusion in the periphery of the die (chip) which covers the entire thickness of the die, but with minimal consumption of die area and minimal additional thermal budget beyond that already employed in standard forward-blocking IGBT fabrication techniques. The very deep diffused region is formed by etching one or more trench frames in the periphery region of a semiconductor substrate between a reverse-blocking edge termination structure and a kerf region of the semiconductor substrate, and depositing a p-type dopant source which at least partly fills each trench frame. P-type dopants are then diffused from the p-type dopant source into the surrounding semiconductor material, so as to form a continuous p-type doped region in the periphery region which extends from the top surface of the semiconductor substrate to the bottom surface after thinning of the substrate at the bottom surface. The continuous p-type doped region electrically connects the die backside to the die front-side.

Figure 1:
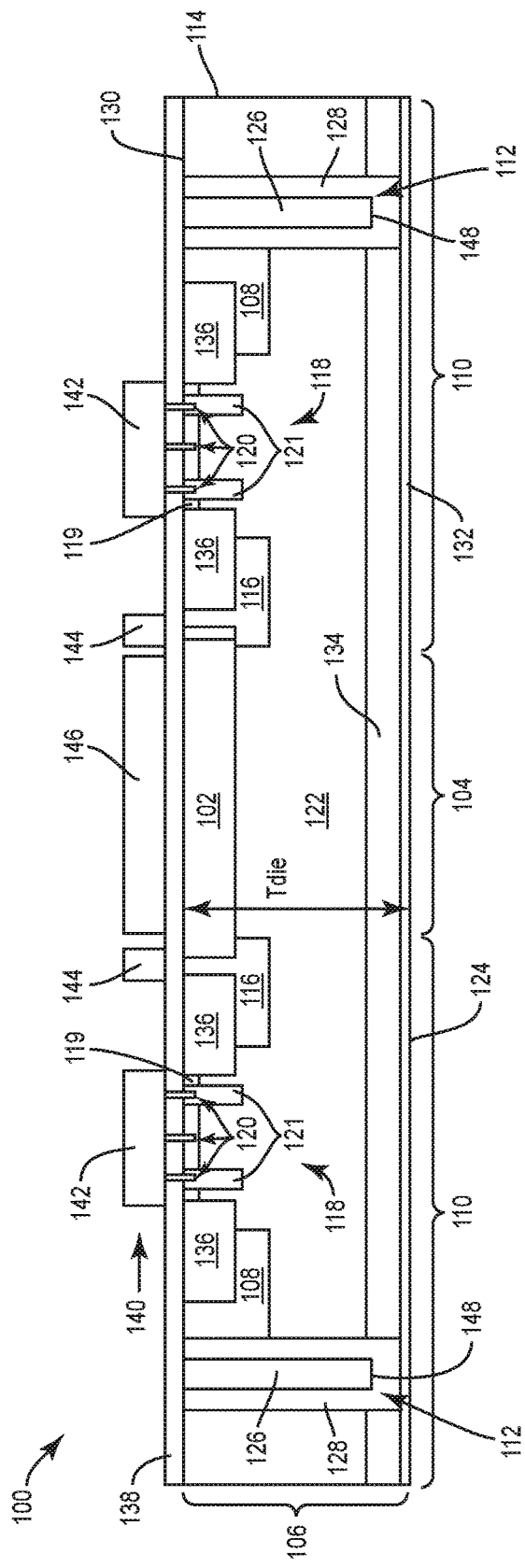
FIG. 1 illustrates a sectional view of a semiconductor die (chip) that includes a reverse-blocking IGBT (insulated gate bipolar transistor) having a trench frame in the periphery of the die filled with a p-type dopant source.

FIG. 1 illustrates a sectional view of a semiconductor die (chip) 100 that includes a reverse-blocking IGBT (insulated gate bipolar transistor) device. The reverse-blocking IGBT device comprises a plurality of IGBT cells 102 disposed in a device region 104 of a semiconductor substrate 106, and a reverse-blocking edge termination structure 108 disposed in a periphery region 110 of the semiconductor substrate 106 which surrounds the device region 104. The size of the periphery region 110 in relation to that of the device region 104 is intentionally exaggerated in FIG. 1, so as to emphasize the construction of the periphery region 110 over that of the device region 104. In practice, the device region 104 is larger than the periphery region 110 and therefore occupies more substrate area than the periphery region 110. Furthermore, the IGBT cells 102 contained in the device region 104 are not shown in any detail. The particular IGBT cell construction is irrelevant, and any standard IGBT cell type can be employed. IGBT cells combine the advantages of bipolar and MOS field effect transistors, and are typically constructed similarly to a n-channel vertical construction power MOSFET except that the n+ drain is replaced with a p+ collector layer, thus forming a vertical PNP bipolar junction transistor. The additional p+ region creates a cascade connection of the PNP bipolar junction transistor with a surface n-channel MOSFET.

Outside the device region 104, one or more trenches 112 are formed in the periphery region 110 between the reverse-blocking edge termination structure 108 and an edge face 114 of the semiconductor substrate 106. The reverse-blocking edge termination structure 108 is illustrated as a VLD (variation of lateral doping) type edge termination. IGBT device destruction can occur localized at the edge termination. VLD type edge terminations represent one termination technique for increasing the ruggedness of an IGBT device. Other types of reverse-blocking edge termination structures can be used such as e.g. a JTE (junction termination extension) type edge termination. In each case, the reverse-blocking edge termination structure 108 prevents a depletion layer (or space charge region) from reaching the edge face 114 of the semiconductor substrate 106 in reverse blocking mode.

The reverse-blocking IGBT device includes a forward-blocking edge termination structure 116 disposed in the periphery region 110 between the reverse-blocking edge termination structure 108 and the device region 104. The forward-blocking edge termination structure 116 can have the same or different construction as the reverse-blocking edge termination structure 108, e.g. VLD-type, JTE-type, etc., and prevents a depletion layer (or space charge region) from reaching the edge face 114 of the semiconductor substrate 106 in forward blocking mode under normal conditions. In this case, the forward-blocking edge termination structure 116 prevents the space charge from reaching a channel stopper region 118 and a p-doped region of reverse-blocking edge termination structure 108. The channel stopper region 118 is disposed in the periphery region 110 between the reverse-blocking and forward-blocking edge termination structures 108, 116. The channel stopper 118 has a dual role under normal conditions in that the channel stopper region 118 is shared by both edge termination structures 108, 116. Depending on whether Vce>0 or Vce<0, where Vce is the voltage across the collector and emitter of the IGBT, the space charge coming from the forward-blocking edge termination structure 116 or the space charge coming from the reverse-blocking edge termination structure 108 should be stopped from reaching the channel stopper region 118.

The channel stopper region 118 includes a metal field plate 142 electrically connected through a thick dielectric insulation 138, by one or more conductive vias or contact holes 120, to the drift zone (n-type) potential. An optional n-doped layer 119 surrounds and protects each conductive via/contact hole 120 from punch-through of the space charge during blocking. One or more optional trenches 121, also electrically contacted to the metal field plate 142, provide further protection of the contact to the drift zone 122. The channel-stopper 118 limits spread of the channel area from the device region 104 and/or prevents the formation of parasitic channels (i.e. inversion layers) in both forward and reverse blocking modes. The channel-stopper 118 is surrounded by the one or more trenches 112 formed in the periphery region 110 between the reverse-blocking edge termination structure 108 and the edge face 114 of the semiconductor substrate 106. Each of these trenches 112 extends deeply into the semiconductor substrate 106 nearly or entirely to the back surface 124 of the die 100, and forms a frame in the periphery region 110 of the die 100 which surrounds the reverse-blocking edge termination structure 108. The frame formed by the trench(es) 112 can be continuous or segmented as described later herein. The trench(es) 112 are also referred to herein as trench frame(s).

A p-type dopant source 126 at least partly fills each trench frame 112 formed in the periphery region 110 between the reverse-blocking edge termination structure 108 and the edge face 114 of the semiconductor substrate 106. Each trench frame 112 can be filled only with boron-doped polysilicon, only with boron-doped silicate glass or both boron-doped polysilicon and boron-doped silicate glass as the p-type dopant source 126 according to an embodiment. For example, the p-type dopant source 126 can comprise a conformal layer of boron-doped silicate glass disposed along the sidewalls and bottom of each trench frame and boron-doped polysilicon which occupies space in the trench frame 112 unoccupied by the conformal layer of boron-doped silicate glass. An oxide liner (not shown in FIG. 1) such as $SiO_2$ can be disposed on the sidewalls and bottom of each trench frame 112 prior to deposition of the p-type dopant source 126, so as to separate the p-type dopant source 126 from the surrounding semiconductor material.

In each case, a continuous p-type doped region 128 disposed in the periphery region 110 is formed from p-type dopants out-diffused from the p-type dopant source 126. The continuous p-type doped region 128 extends from the top surface 130 of the semiconductor substrate 106 to the bottom surface 124. The continuous p-type doped region 128 connects a p-type collector 132 disposed at the bottom surface 124 of the semiconductor substrate 106 to the reverse-blocking edge termination structure 108 at the top surface 130 of the substrate 106 in the periphery region 110 of the IGBT device. The IGBT device can also include an n-type field stop region 134 disposed in the semiconductor substrate 106 above the p-type collector 132 and below the reverse-blocking edge termination structure 108, the n-type field stop region 134 extending laterally from the device region 104 into the periphery region 110. The continuous p-type doped region 128 extends vertically through the n-type field stop region 134 uninterrupted in the periphery region 110. That is, the p-doping in the periphery region 110 is not compensated by the field stop doping, so as to keep the continuity of the p-type doping between front and back surfaces 124, 130 of the semiconductor substrate 106. The continuous p-type doped region 128 also is isolated from the forward-blocking edge termination structure 116 and from the channel stopper 118 by dielectric isolation regions 136.

With such a construction in the periphery region 110 of the IGBT die 100, an electrical connection is provided from the bottom surface 124 of the semiconductor substrate 106 to the top surface 130 through the entire thickness (Tdie) of the die 100 in the periphery region 110 so as to realize a reverse blocking IGBT which prevents a depletion layer (or space charge region) from reaching the edge face 114 of the semiconductor substrate 106 in reverse blocking mode. An insulating layer 138 such as $SiO_2$ is formed on the top surface 130 of the semiconductor substrate 106 so as to separate the substrate 106 from an overlying metallization layer 140. The metallization layer 140 is patterned so as to provide respective connections to the different components of the IGBT device disposed in the semiconductor substrate 106. For example, the pattered metallization layer 140 can include a first section 142 electrically connected to the channel stopper 118, a second section 144 which forms a gate runner that is electrically connected to gate electrodes of the IGBT cells 102 disposed in the device region 104, and a source pad 146 electrically connected to the source region of the IGBT cells 102. Other electrical connections can be provided between the pattered metallization layer 140 and additional components of the IGBT device disposed in the semiconductor substrate 106 and are out-of-view in FIG. 1, as are the corresponding via connections extending through the insulating layer 138 formed on the top surface 130 of the substrate 106.

The IGBT device has scalability to 1200V and 1700V classes. The scalability is related to the ability to etch and fill the trench frame 112 with a suitable p-type dopant source 126, such as boron-doped silicate glass or boron-doped silicate glass plus boron-doped polysilicon. The die thickness Tdie determines the trench aspect ratio. For a 1200V class device, an aspect ratio of 1:70 for a 2 μm wide trench frame 112 and an aspect ratio of 1:50 for a 3 μm wide trench frame 112 is typical. For a 1700V class device, an aspect ratio of 1:95 for a 2 μm trench frame 112 and an aspect ratio of 1:60 for a 3 μm trench frame 112 is typical. Such parameters are attainable with standard trench etch processes employed in fabricating DRAM trench capacitors and with Bosch-type etch processing. The trench filling also can be realized with standard processing. For example, the distance between the trench bottom 148 and the bottom surface 124 of the die 100 is the same as in the 650V class, for +/−3 μm thinning accuracy. If the thinning accuracy is relaxed to +/−5 μm, then the maximum diffusion depth for the p-type dopant source 126 reaches 12.5 μm to 17.5 μm. An additional thermal treatment can be used to diffuse boron at such depths. However, boron-doped silicate glass can be considered a nearly infinite diffusion source at such diffusion depths, permitting diffusion to 12.5 μm, 17.5 μm or even deeper while maintaining sufficiently high doping levels for the continuous p-type doped region 128 at such depths.

A single trench frame 112 is shown in FIG. 1 between the reverse-blocking edge termination structure 108 and the edge face 114 of the semiconductor substrate 106. However, more than one trench frame 112 can be formed in the periphery region 110 and partly or completely filled with a p-type dopant source 126 from which p-type dopants are out-diffused so as to form the continuous p-type doped region 128. Each trench frame 112 also can have different constructions.

FIGS. 2A through 2C illustrate respective top plan view of different trench frame embodiments. Only the edge face 114 of the semiconductor die 100 and the trench frame 112 are shown in FIGS. 2A through 2C for ease of illustration. In FIG. 2A, a single continuous trench frame 112 is formed in the periphery region and partly or completely filled with the p-type dopant source 126. In FIG. 2B, the trench frame 112 is segmented into a plurality of spaced-apart segments each of which is formed in the periphery region 110 and partly or completely filled with the p-type dopant source 126. The trench segments are spaced laterally close enough such that p-type dopants out-diffused from the dopant source 126 form the continuous p-type doped region 128 in the periphery region 110. In the case of boron-doped silicate glass as the p-type dopant source 126, the stress induced by the boron-doped silicate glass is lower than that induced by thermal oxide because boron increases the thermal expansion coefficient of $SiO_2$, making it closer to Si, and boron-doped silicate glass flows and releases stress down to approximately 900°, which thermal oxide does not do. To further release stress due to the trench frame 112, the segmented periphery trench frame 112 shown in FIG. 2B can be used, with gaps comparable to the diffusion length of the boron during a standard thermal treatment process. The embodiment shown in FIG. 2C is similar to the one shown in FIG. 2B. Different, however, is that the segments of the trench frame 112 are arranged in a staggered manner in FIG. 2C i.e. disposed on alternating sides of a center line. The segments of the trench frame 112 can be misaligned by a distance ranging from a few hundreds of nm to a few microns, at each transition.

Figure 3A:
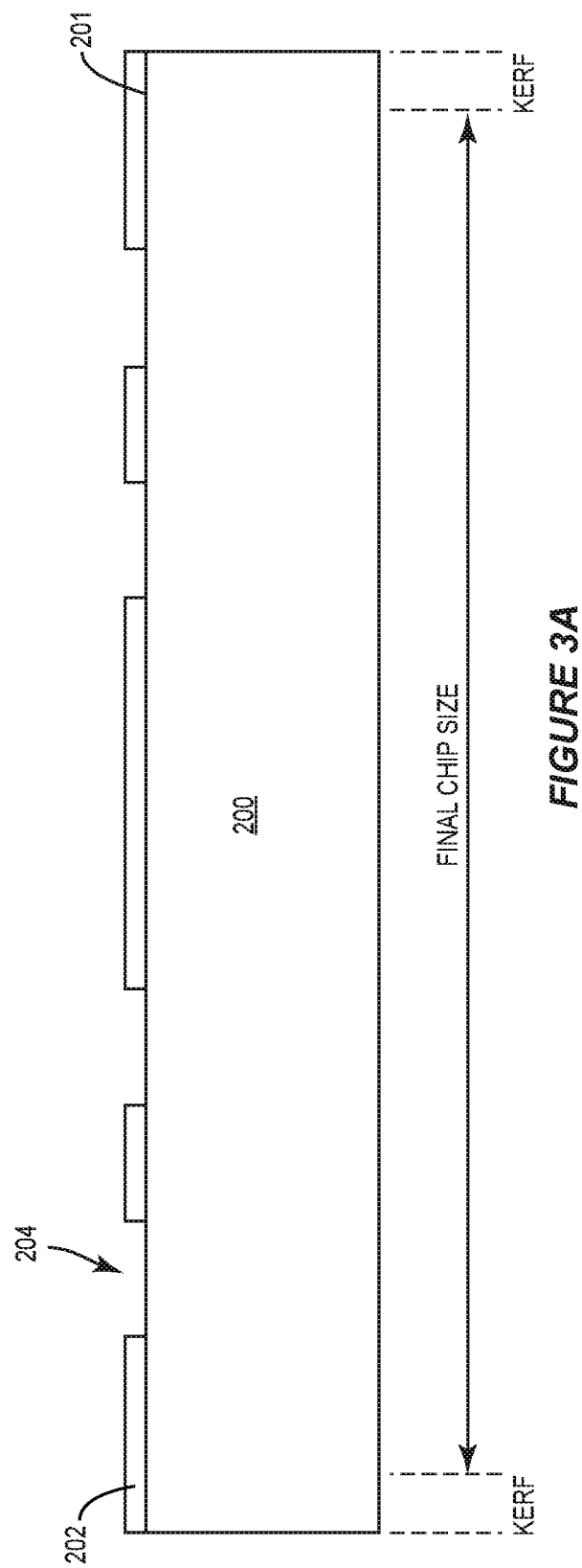
FIGS. 3A through 3N illustrate partial sectional views of a semiconductor substrate during different stages of manufacturing the reverse-blocking IGBT shown in FIG. 1.
Figure 3B:
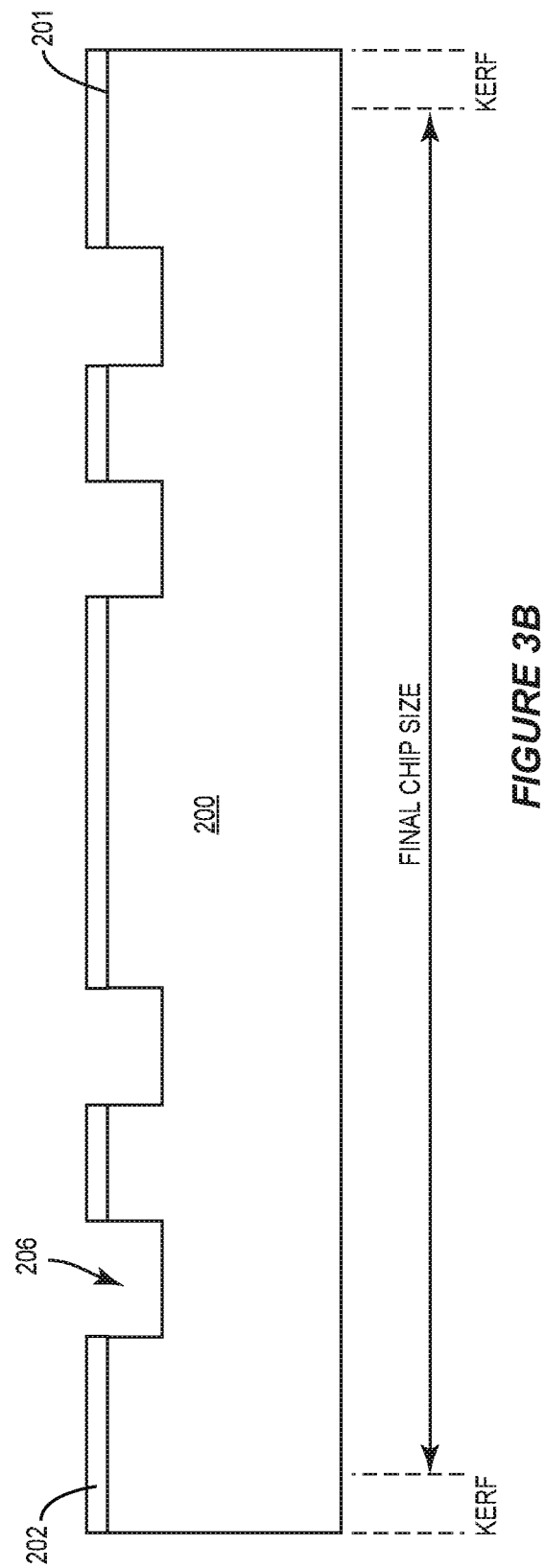
Figure 3C:
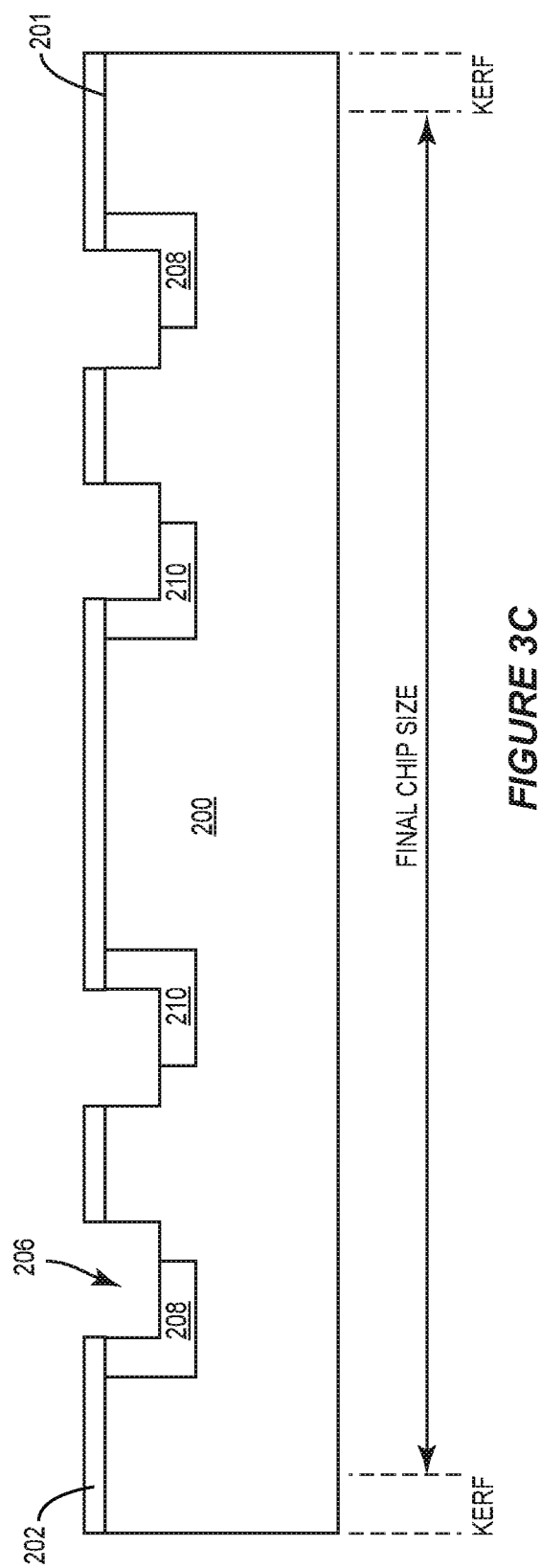
Figure 3D:
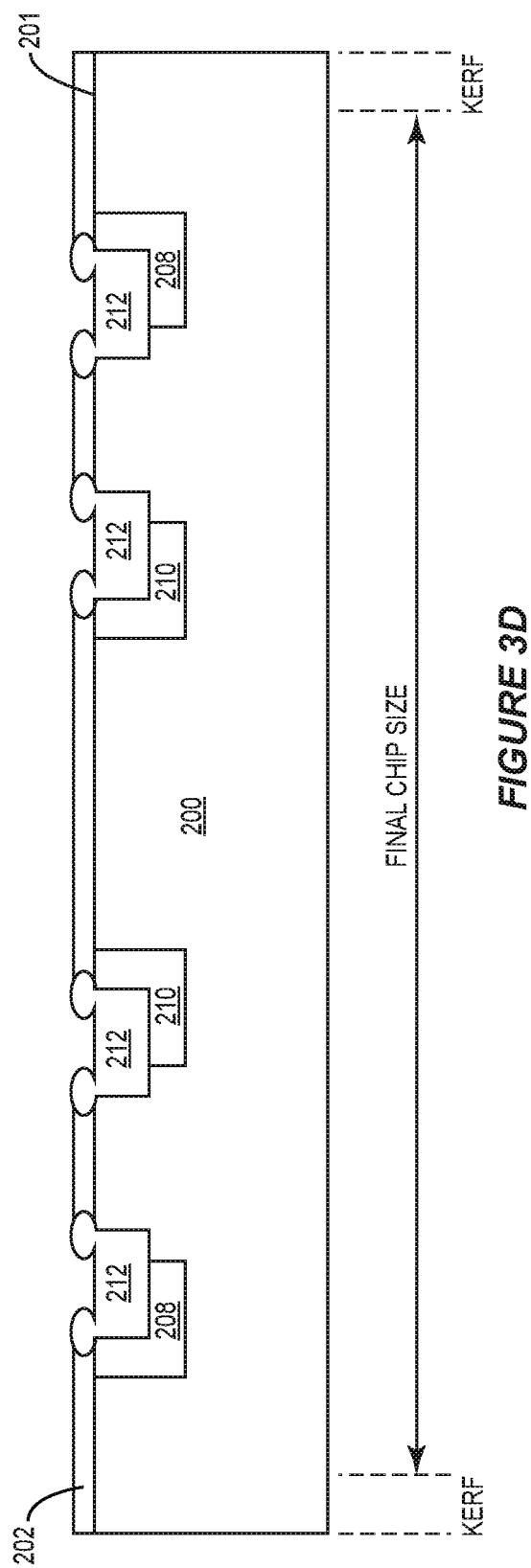
Figure 3E:
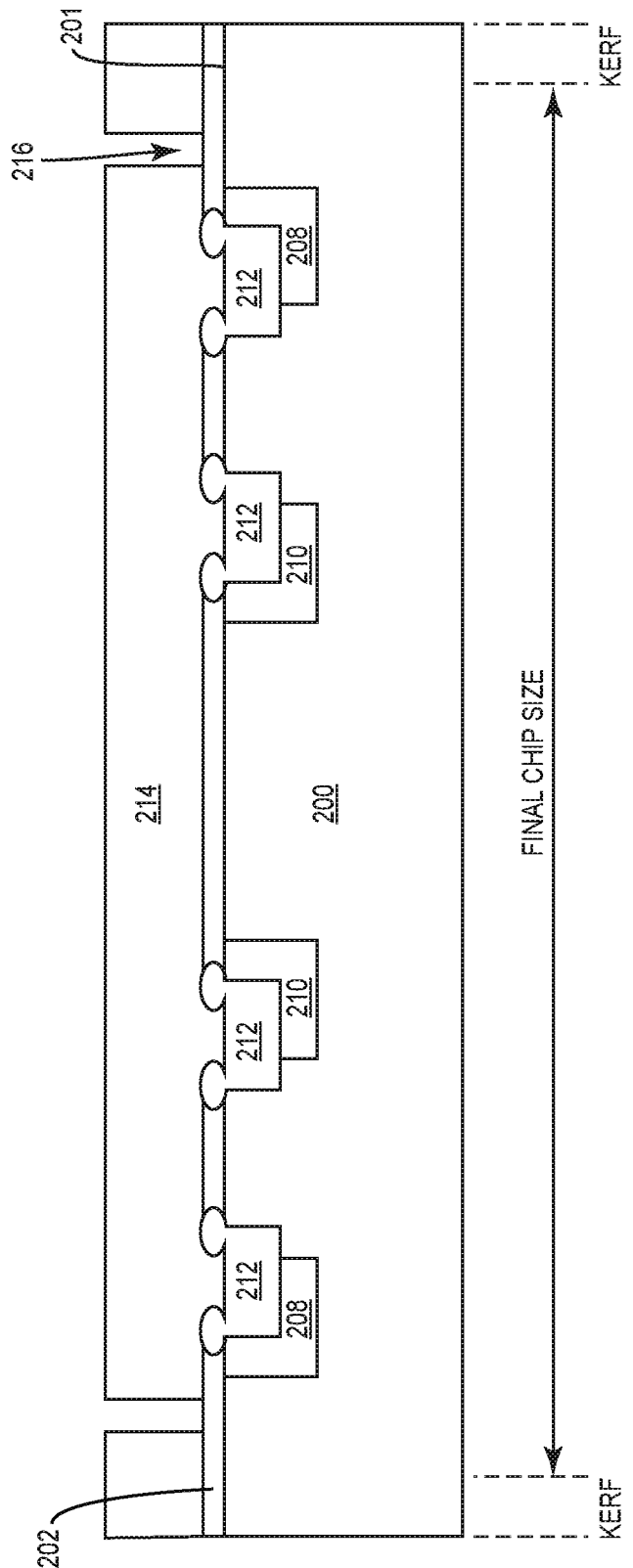
Figure 3F:
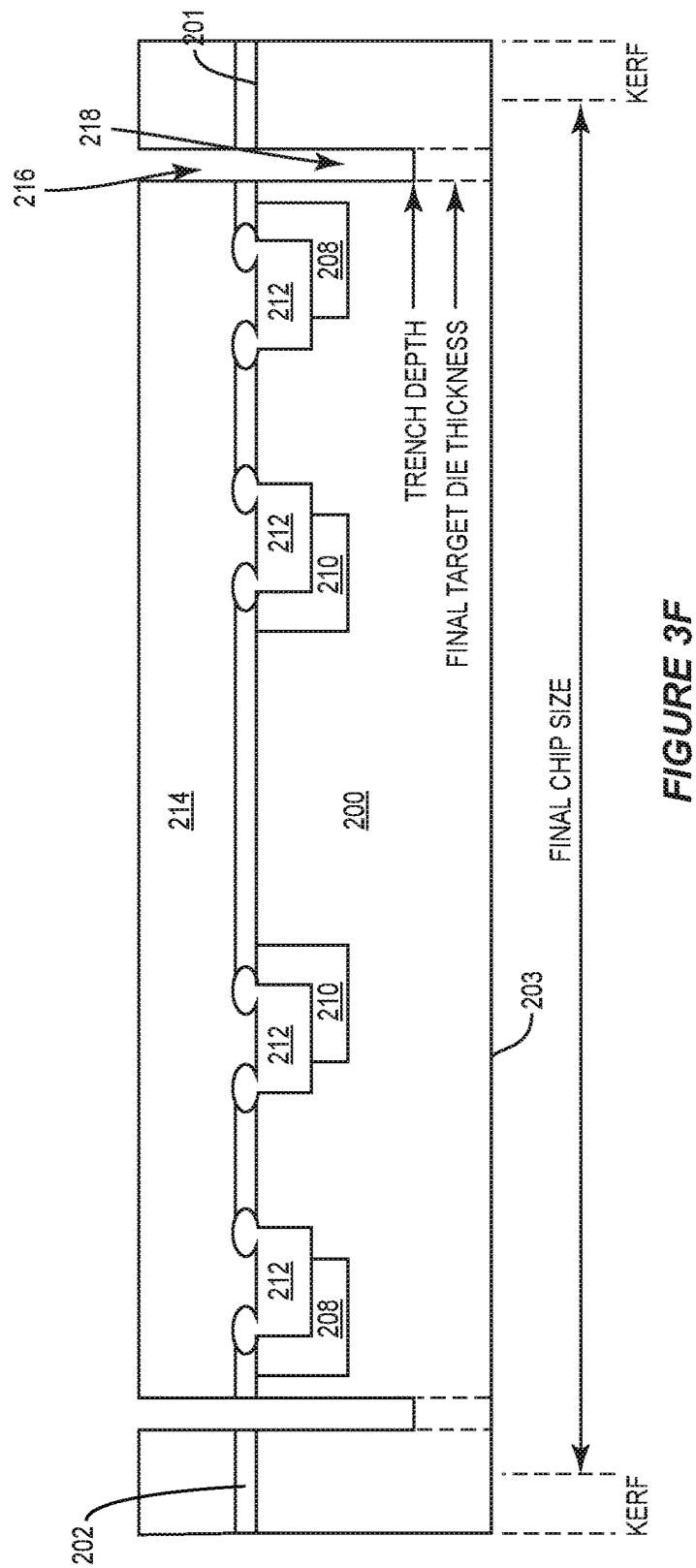
Figure 3G:
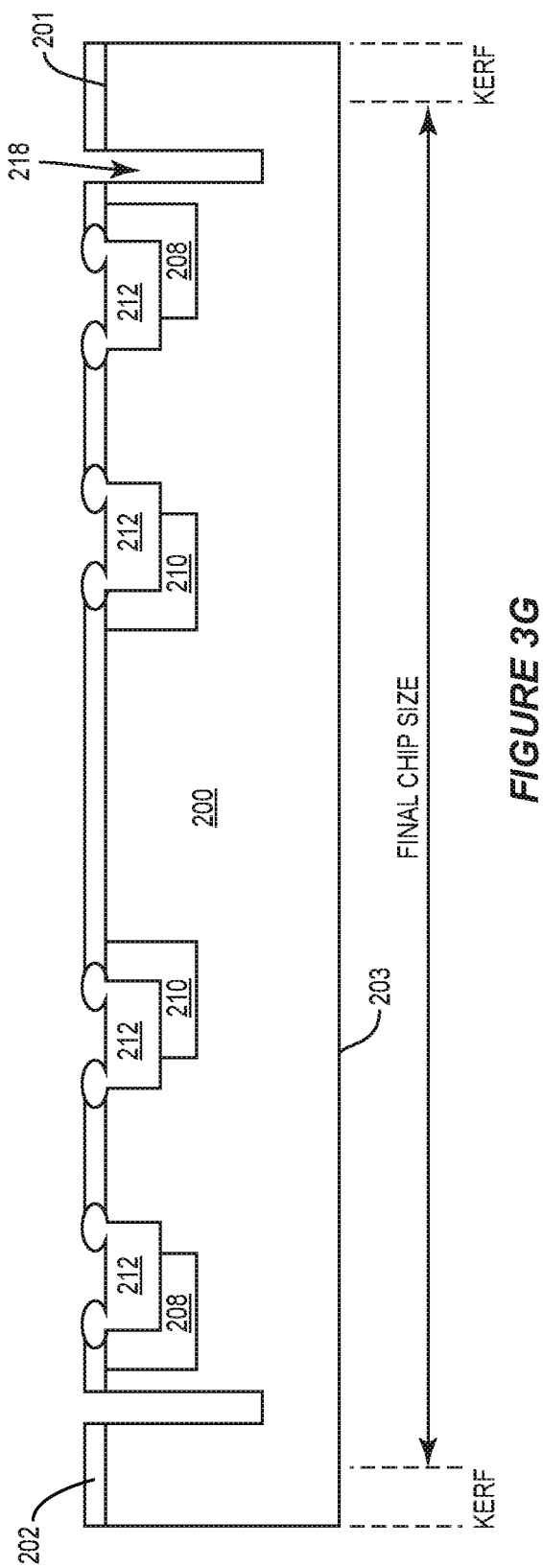
Figure 3H:
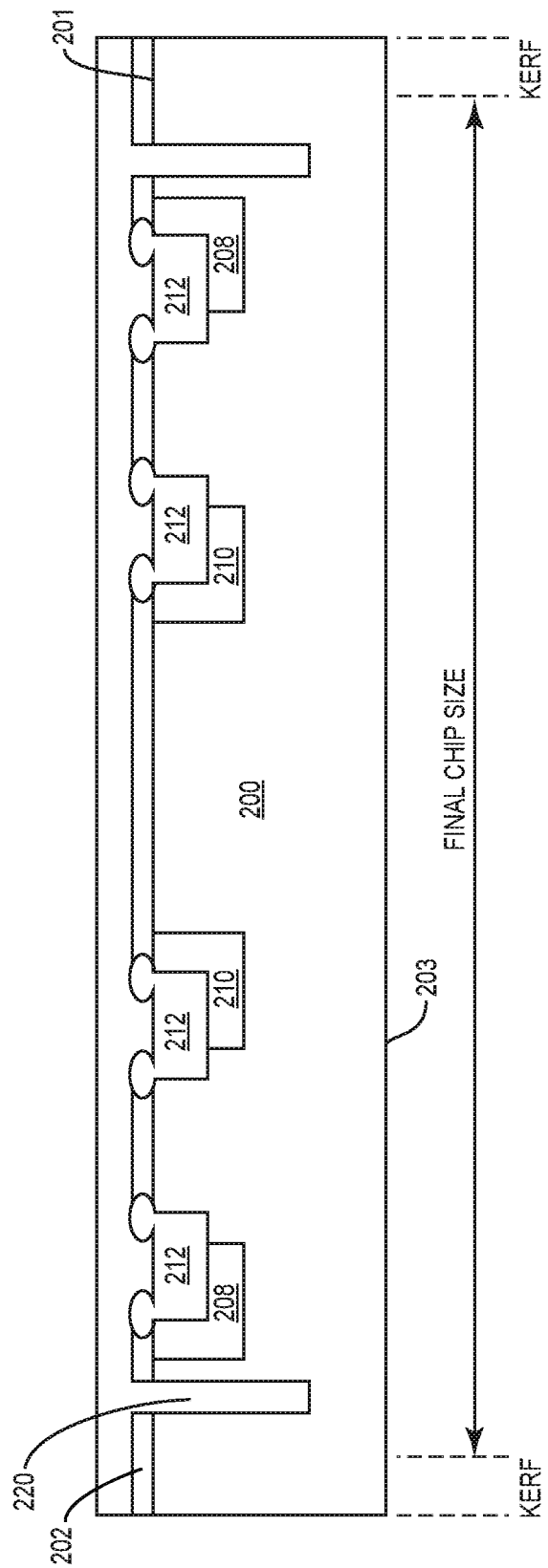
Figure 3I:
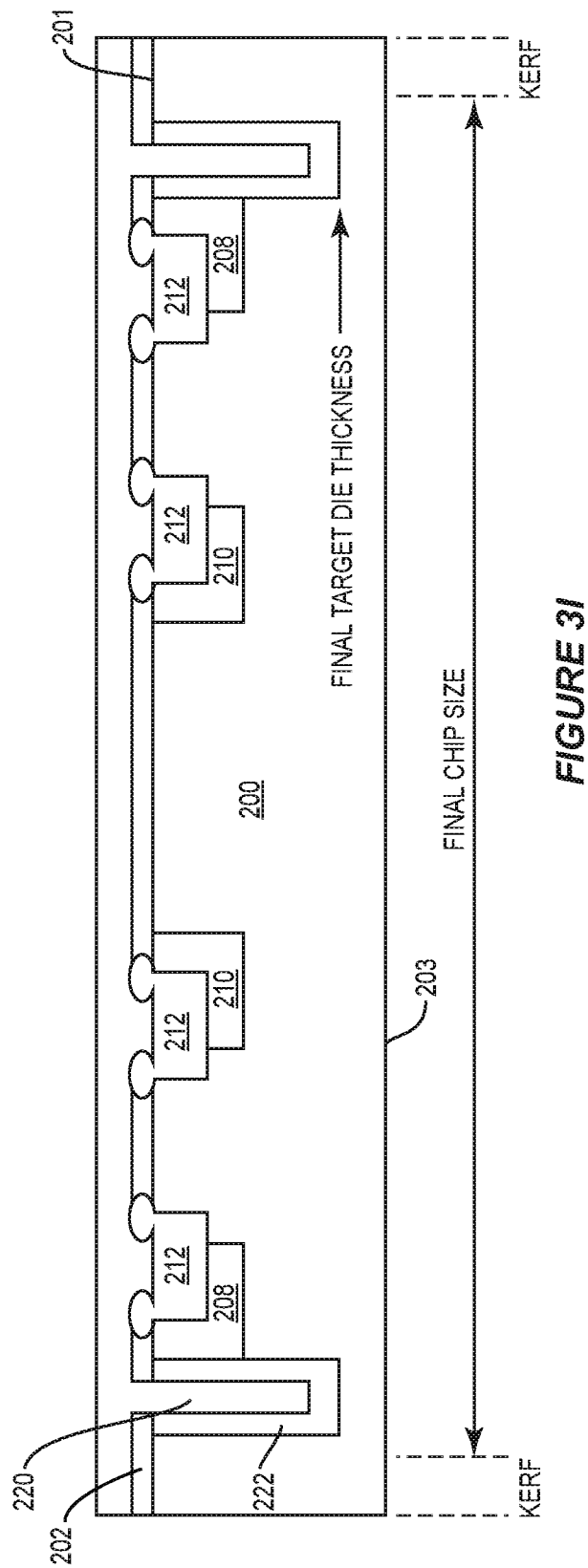
Figure 3J:
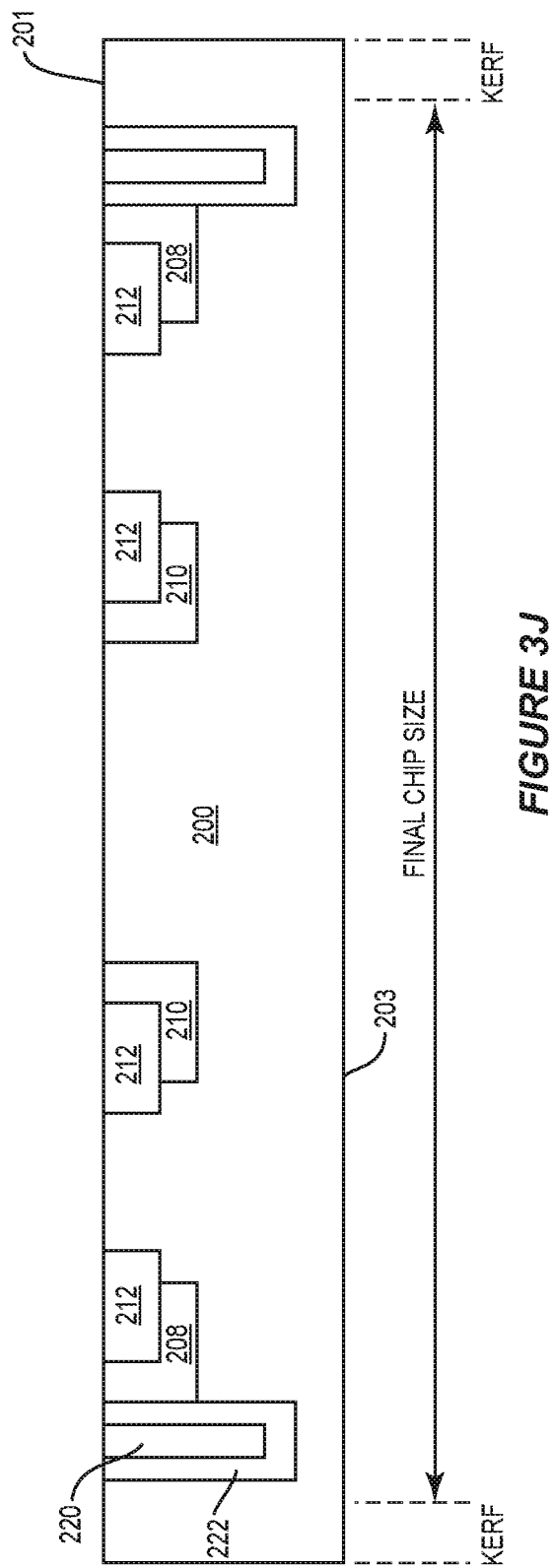
Figure 3L:
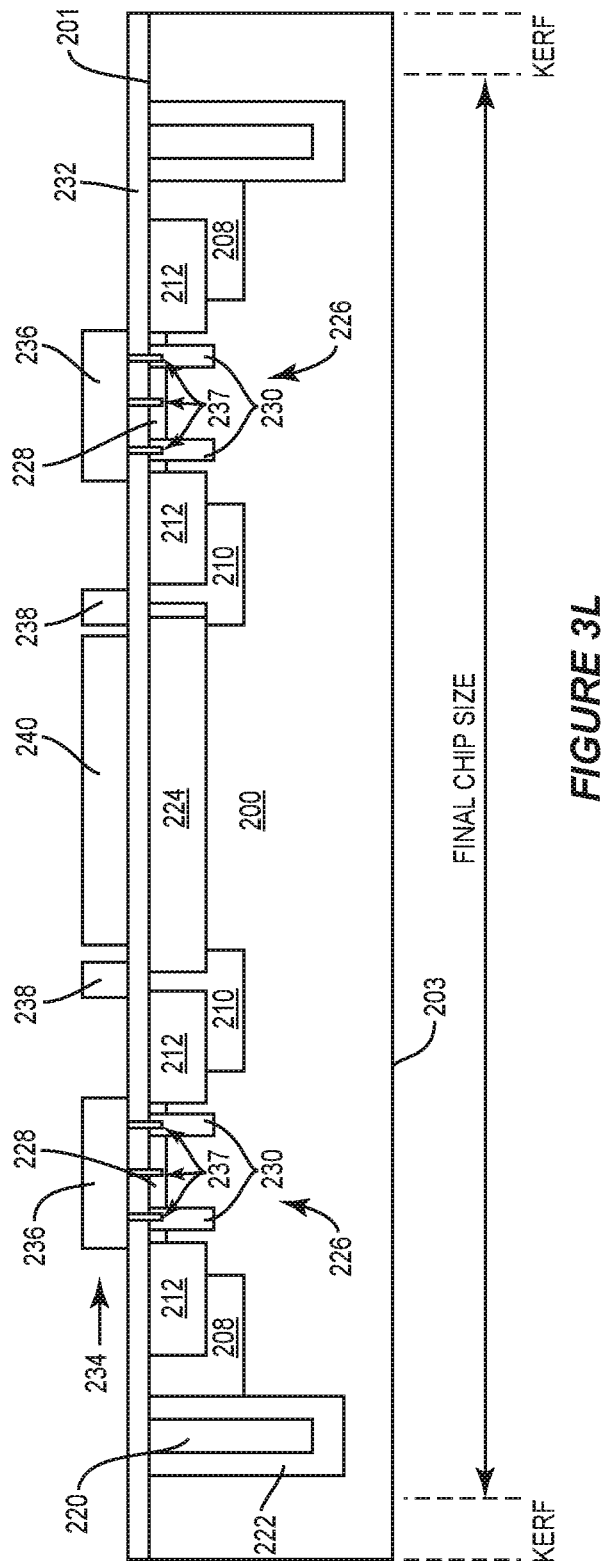
Figure 3M:
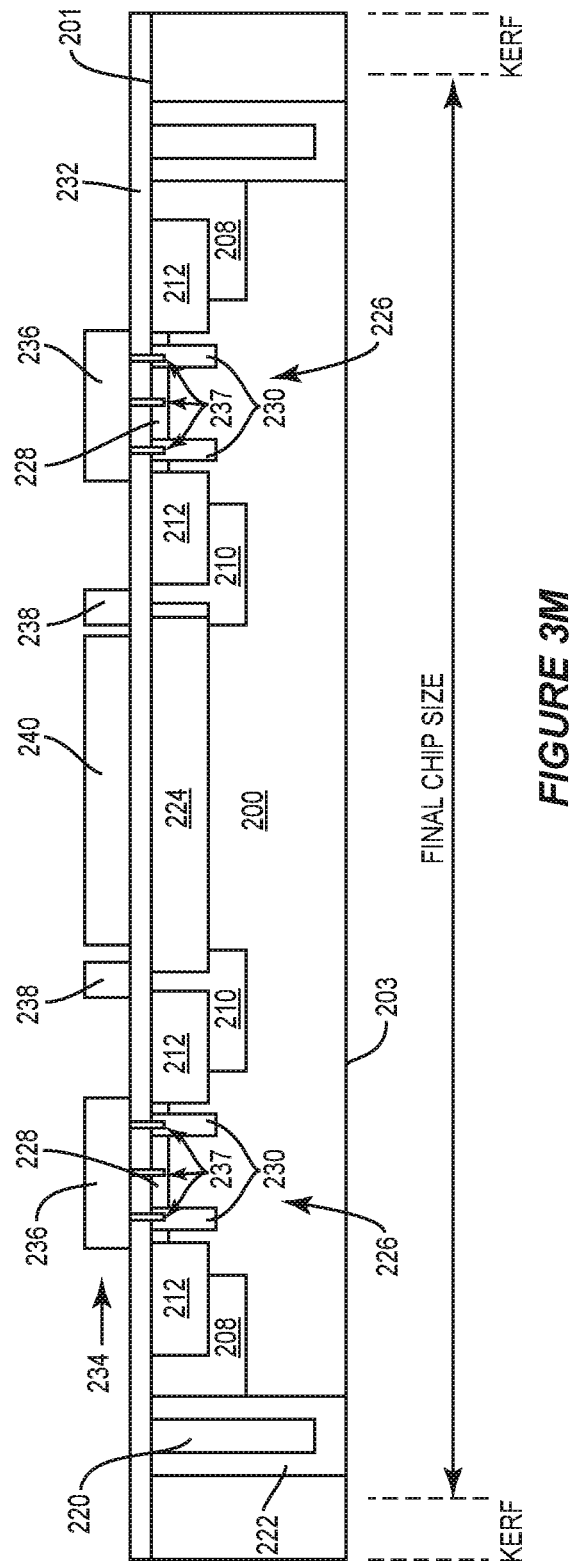
Figure 3N:
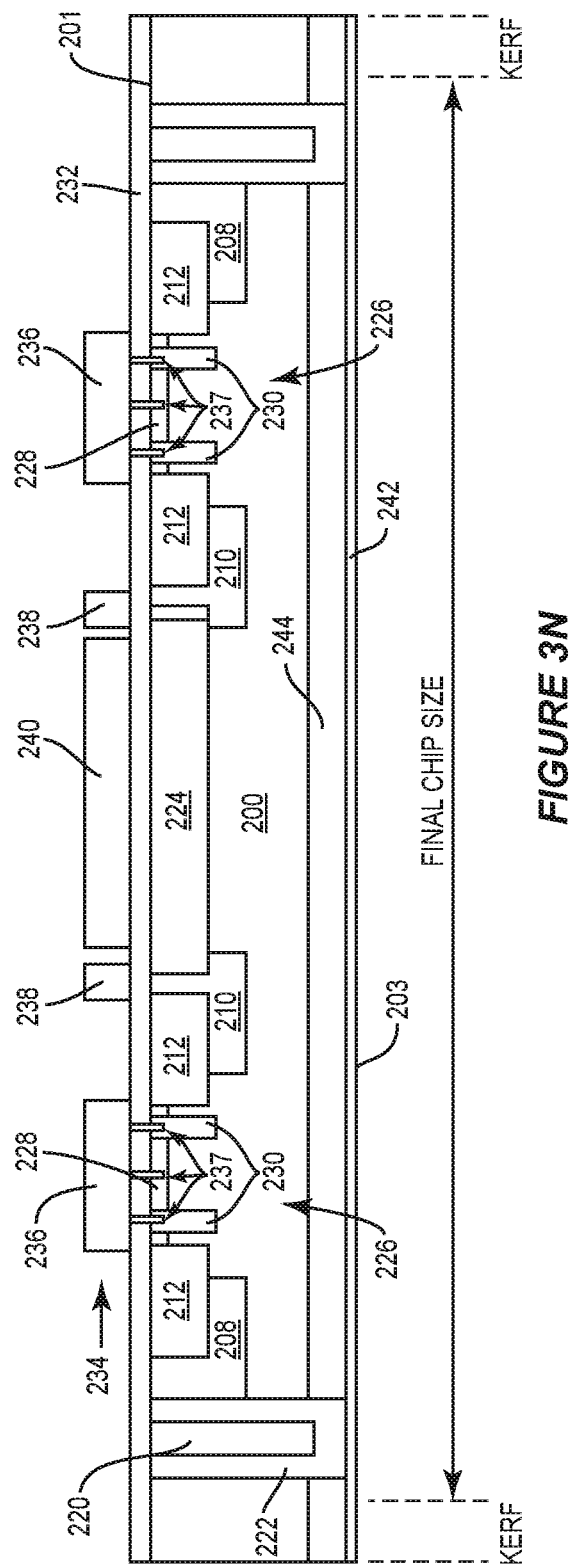

FIGS. 3A through 3N illustrate an embodiment of a method of manufacturing a plurality of reverse-blocking IGBT dies of the kind shown in FIG. 1. The IGBT dies are fabricated on a common semiconductor substrate 200 such as a silicon wafer. After the IGBTs dies are completed, the dies are singulated by a die singulation process which involves physically separating (dividing) the IGBT dies from one another along a kerf region e.g. by a saw blade or laser cutting. FIGS. 3A through 3N illustrate one IGBT die fabricated on the semiconductor substrate 200 and the kerf region which separates that IGBT die from neighboring dies which are out-of-view.

In FIG. 3A, a LOCOS (LOCal Oxidation of Silicon) mask 202 such as $SiO_2/Si_3N_4$ is deposited on the top surface 201 of the semiconductor substrate 200. LOCOS is a process where silicon dioxide is formed in selected areas on a silicon wafer wherein the resulting Si—$SiO_2$ interface is at a lower point than the rest of the silicon surface. Openings 204 in the LOCOS mask 202 determine where the silicon dioxide is subsequently formed.

In FIG. 3B, trenches 206 are etched into the semiconductor substrate 200 through the openings 204 in the LOCOS mask 202 before the silicon dioxide is formed. The trenches 206 shown in FIG. 3B define where the reverse and forward-blocking edge termination structures are to be formed. Any standard etching process can be used to form the trenches 206.

In FIG. 3C, p-type dopants are implanted into the trenches 206 formed in the semiconductor substrate 200 so as to define the reverse and forward-blocking edge termination structures 208, 210 in the periphery region of each IGBT. Any standard dopant implantation process can be used to define the reverse and forward-blocking edge termination structures 208, 210. The reverse and forward-blocking edge termination structures 208, 210 can have a JTE, VLD or other type of design.

In FIG. 3D, the exposed sidewalls and bottom of the trenches are oxidized in a standard recessed LOCOS process so as to form isolation regions 212.

In FIG. 3E, a resist 214 of medium thickness e.g. 2-3 μm is deposited over the top surface 201 of the semiconductor substrate 200 using standard lithographic processing. The resist 214 has an opening 216 with the shape of a frame which extends around the periphery of each IGBT die. The position of the opening 216 is located just outside the reverse-blocking edge termination structure 208. The opening 216 formed in the resist 214 defines the trench frame region for a p-type dopant source. The resist 214 can define more than one trench frame by having more than one opening 216 encircling the periphery of each IGBT die. Each trench frame region defined by the resist 214 is located between the reverse-blocking edge termination structure 208 and the kerf region.

In FIG. 3F, the part of the LOCOS mask 202 exposed by each opening 216 in the resist 214 is plasma etched and followed by a deep trench etch in each trench frame region defined by the resist 214. The LOCOS mask 202 is thin enough such that the etching could be performed in-situ in a trench etch tool, but may be performed elsewhere. In one embodiment, each trench frame 218 is formed by standard Bosch-type etching which allows very high aspect ratios and very high selectivity to photo-resist. Bosch-type etching, also known as pulsed or time-multiplexed etching, alternates repeatedly between two modes so as to achieve nearly vertical structures. In the trench etch process, the exposed area of the trench etch is very small, e.g. in the 1% range, and at these conditions Bosch-type etching typically has a very high control of depth uniformity. In one specific example, a target trench width can be 2 μm and the depth is preferably below the final target thickness specified for the IGBT dies. For a +/−0.5 μm trench depth uniformity and +/−3 μm die thickness tolerance, the target depth is 56 μm for a 60 μm die target thickness. In this specific exemplary case, the aspect ratio (AR) of the trench frame 218 is 1:28. Assuming a tolerance of +/−3 μm in the final target die thickness, the maximum distance of the trench bottom from the die backside surface is 7.5 μm in this specific example. Other die thicknesses, trench aspect ratios and trench bottom spacings are within the scope of the embodiments described herein, and the examples described above should not be considered limiting. For example, the distance of the trench bottom from the final target die thickness can be greater than 7.5 um e.g. 12.5 μm or even more depending on the fabrication tolerances. Alternatively, the trench depth can extend to the final die thickness or even deeper into the semiconductor substrate 200 as indicated by the dashed vertical lines in FIG. 3F. In one embodiment, each trench frame 218 is etched at a depth greater than the final target thickness specified for the IGBT dies, or even completely through the semiconductor substrate 200, before the substrate 200 is thinned at the bottom surface 203.

The final target die thickness is the target thickness of each IGBT die after the backside 203 of the semiconductor substrate 200 is thinned. If the trench frame depth does not reach the final target die thickness, the distance between the trench bottom and the final target die thickness should be such that the semiconductor material remaining below the trench bottom in each IGBT die is sufficiently doped by out-diffusion of the p-type dopant source to be deposited in each trench frame 218 such that an electrical connection is provided from the bottom surface of each IGBT die to the top surface through the entire thickness of the die in the periphery region so as to realize a reverse blocking IGBT which prevents a depletion layer (or space charge region) from reaching the edge face of the die in reverse blocking mode as previously described herein in connection with FIG. 1.

In FIG. 3G, the resist 214 is stripped followed by a post-etch clean. Standard resist strip and post-etch clean processes can be used.

In FIG. 3H, a p-type dopant source 220 is deposited in each trench frame 218 etched in FIG. 3F. The p-type dopant source 220 at least partly fills each trench frame 218. In one embodiment, the p-type dopant source 220 comprises a conformal layer of boron-doped silicate glass deposited along the sidewalls and bottom of each trench frame 218 using a high conformal deposition technology such as SACVD (sub-atmospheric chemical vapor deposition). In one case, the conformal layer of boron-doped silicate glass has a boron concentration of about 4% before the p-type dopants are out-diffused from the p-type dopant source into the surrounding semiconductor material. Given that $SiO_2$ has a molecular density of 2.3E22 $cm^{-3}$ and with such a boron concentration, a p-type dopant source of 8E20 $cm^{-3}$ is provided in each trench frame 218 formed outside the reverse-blocking edge termination structure 208 of each IGBT die. Such a p-type dopant source yields, along the entire thickness of each IGBT die, a practically infinite diffusion source, which can allow at the same time a high diffusion depth and a high doping level along the full die thickness.

Alternatively, or in addition, the p-type dopant source 220 can comprise a conformal layer of boron-doped silicate glass that partly fills each trench frame 218 so that part of each trench frame 218 is unfilled by the conformal layer of boron-doped silicate glass. The p-type dopant source 220 further includes boron-doped polysilicon or a combination of $SiO_2$ and boron-doped polysilicon which fills the previously unfilled part of each trench frame 218. According to this embodiment, the conformal layer of boron-doped silicate glass can have a thickness between 200 nm to 600 nm and the boron-doped polysilicon and/or $SiO_2$ (if included) occupies the remainder of each trench frame 218. In yet another embodiment, each trench frame 218 is filled with only boron-doped polysilicon or with only a combination of boron-doped polysilicon and $SiO_2$.

In FIG. 3I, p-type dopants are out-diffused from the p-type dopant source 220 through the sidewalls and bottom of each trench frame 218 into the surrounding semiconductor material so as to form a continuous p-type doped region 222 in the periphery region of each IGBT die. The continuous p-type doped region 222 extends from the top surface 201 of the semiconductor substrate 200 at least to the final target die thickness i.e. the die thickness after thinning of the semiconductor substrate 200 at the bottom surface 203. In the case of boron-doped silicate glass as the p-type dopant source 220, a standard thermal treatment can be used to densify the doped glass. Some boron will have already diffused into the surrounding semiconductor material prior to the thermal treatment.

Dopant diffusion and activation also occurs in the edge termination regions so as to form the reverse and forward blocking edge termination structures 208, 210. During the high-thermal-budget diffusion of the edge termination dopants, boron also out-diffuses from the p-type dopant source 220 in each trench frame 218 into the surrounding semiconductor material. This diffused boron dopes, at a high doping level, even the portion of the semiconductor substrate below the trench bottom in case the trench frame(s) are not etched to at least the final target die thickness. Accordingly, the continuous p-type doped region 222 in the periphery region of each IGBT die is distributed over the entire die thickness, yielding a high and uniform p-doping along the die thickness while occupying minimal area by this diffusion region. The forward-blocking edge termination structure 210 is electrically isolated from the continuous p-type doped region 222 and from the reverse-blocking edge termination structure 208 in the periphery region by the previously formed LOCOS structure 212.

In FIG. 3J, the LOCOS mask 202 is removed by a standard CMP (chemical mechanical polishing) process. An optional standard plasma etch back process can be used, in order to shorten the CMP time. If employed, the plasma etch back is stopped before reaching the LOCOS mask 202. The LOCOS mask 202 is used as a CMP stop layer. The LOCOS removal process employs CMP until stopping on the LOCOS mask, then the LOCOS mask 202 is stripped. After the LOCOS mask 202 is removed, the process can return to standard stripe cell IGBT processing just prior to trench etching in the active region of the IGBT dies. Exemplary standard processes are described next in conjunction with FIGS. 3K through 3M.

In FIG. 3K, IGBT cells 224 are constructed in the active area of each IGBT die by standard implantation, diffusion, annealing and oxidation processes. A channel stopper 226 also is formed in the periphery region of each IGBT die between the reverse-blocking edge termination structure 208 and the forward-blocking edge termination structure 210. The channel stopper 226 can include an optional n-doped layer 228 and one or more optional trenches 230 as previously explained herein in connection with FIG. 1. The channel stopper region 226 can be formed during the standard fabrication of the IGBT cells 224, by adjusting the lithography layout.

In FIG. 3L, an interlayer dielectric 232 such as $SiO_2$ and/or $Si_3N_4$ is deposited over the top surface 201 of the semiconductor substrate 200 by a standard deposition process and contact holes (out-of-view) are formed in the interlayer dielectric 232. A metallization layer 234 is formed on the interlayer dielectric 232 by a standard deposition or electroplating process. The metallization layer 234 is patterned so as to form respective connections to the different components of the IGBT cells 224 disposed in the semiconductor substrate 200. For example, the patterned metallization layer 234 can include a field plate section 236 electrically connected through the interlayer dielectric 232, by one or more conductive vias or contact holes 237, to the drift zone (n-type) potential as previously described herein in connection with FIG. 1, a gate runner section 238 electrically connected to the gate electrodes (not shown) of the IGBT cells 224 disposed in the device region, and a source pad 240 electrically connected to the source region of the IGBT cells 224. Other electrical connections can be provided between the patterned metallization layer 234 and additional components of the IGBT cells 224 and are out-of-view in FIG. 3L, as are the corresponding via connections extending through the interlayer dielectric 232 separating the metal layer 234 from the semiconductor substrate 200.

In FIG. 3M, the semiconductor substrate 200 is thinned to a final die thickness by a standard thinning process at the back surface 203 of the substrate 200.

In FIG. 3N, a p-type collector 242 is formed at the bottom surface 203 of the semiconductor substrate 200 after the substrate 200 is thinned at the bottom surface 203. The reverse-blocking edge termination structure 208 is disposed at the top surface 201 of the semiconductor substrate 200, and the continuous p-type doped region 222 in the periphery region connects the p-type collector 242 at the bottom surface 203 to the reverse-blocking edge termination structure 208 at the top surface 201. An n-type field stop region 244 can be formed in the semiconductor substrate 200 above the p-type collector 242 and below the reverse-blocking edge termination structure 208. The n-type field stop region 244 can be formed by implantation or epitaxial growth. That is, the entire vertical IGBT structure can be grown epitaxially instead of implanted.

In either case, the n-type field stop region 244, which can have a peak doping of $1E16$ $cm^{-3}$, $1E17$ $cm^{-3}$ or higher at a depth of e.g. 4 μm to 5 μm from the back surface 203 of the substrate 200, extends laterally from the device region into the periphery region. The p-type dopant source 220 disposed in each trench frame 218 in the periphery region of each IGBT die provides a sufficient quantity out-diffused dopants into the surrounding semiconductor material such that the resulting continuous p-type doped region 222 in the periphery region extends vertically through the n-type field stop region 244 uninterrupted. Boron-doped silicate glass having a boron concentration of about 4% before diffusion of the p-type dopants is such a suitable source, and allows the continuous p-type doped region 222 to have a doping concentration well above the peak doping concentration of the n-type field stop layer 244. Each IGBT die is then singulated along the kerf region of the semiconductor substrate 200.

The edge face of each singulated IGBT die does not carry the collector potential at the backside to the channel stopper 226 at the front side. Instead, this connection is done directly by the continuous p-type doped region 222. Accordingly, the metal contact 236 of the channel stopper 226 does not need to be electrically connected to the underlying semiconductor material beyond the LOCOS 212 that separates the channel stopper 226 from the edge face of the die. The embodiment shown in FIG. 3N will keep the IGBT device electrically insulated from the leaky diced edge face of the die after singulation. As an additional precaution, at the cost of an extra lithography step, would an HDR (high dynamic robustness) type backside emitter can be used, in which the backside emitter stops at the continuous p-type doped region 222 just outside the channel stopper 226.

Figure 4A:
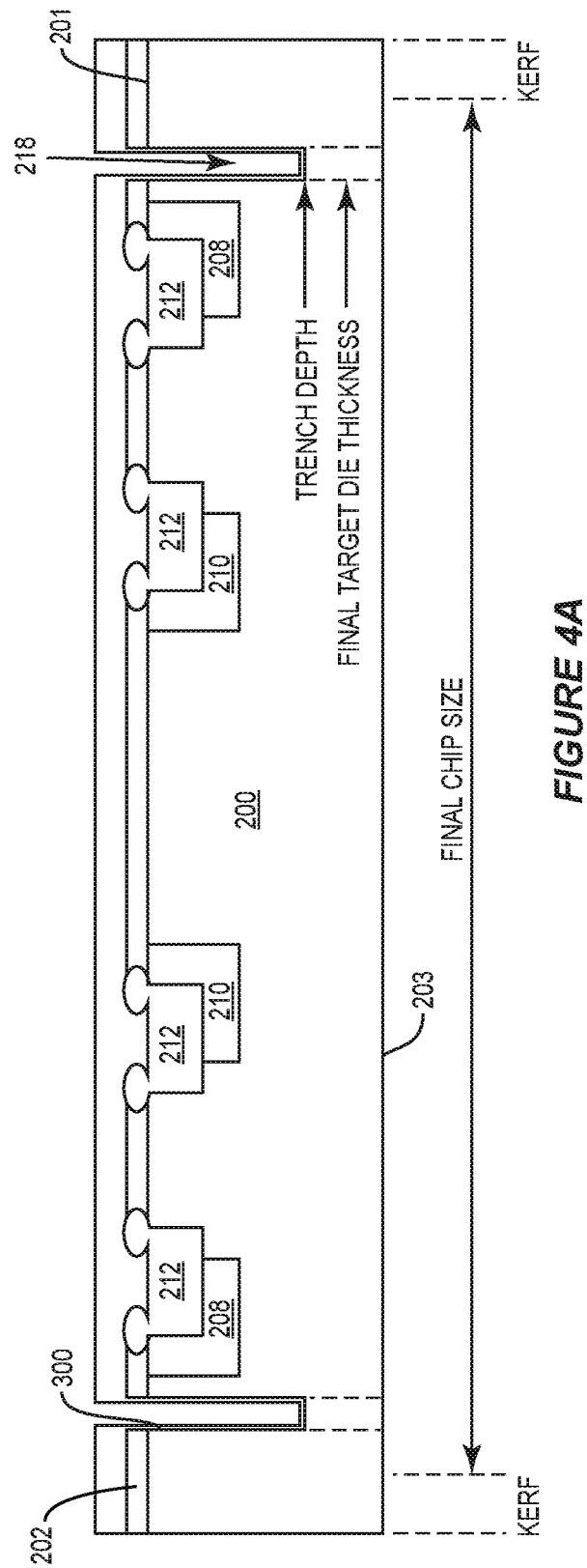
FIGS. 4A through 6 illustrate partial sectional views of the semiconductor substrate shown in FIGS. 3A through 3N according to alternative embodiments.
Figure 4B:
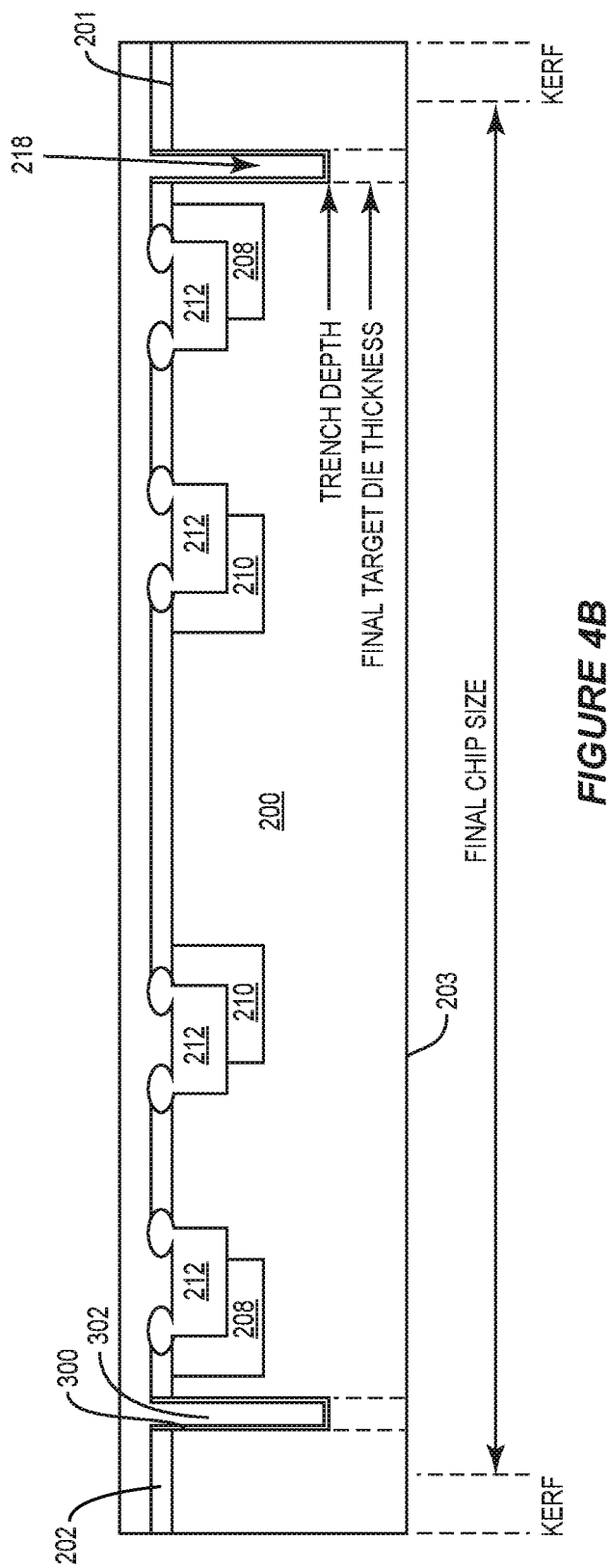

FIGS. 4A and 4B illustrate an alternate embodiment to the process step illustrated in FIG. 3H. In FIG. 3H, boron-doped silicate glass is the sole p-type dopant source 220 deposited in the trench frame 218 etched in the periphery of each IGBT die. In FIG. 4A, a conformal layer of boron-doped silicate glass 300 having a thickness between e.g. 200 nm to 600 nm is deposited on the sidewalls and bottom of the trench frame 218. This way, part of the trench frame 218 is unfilled by the conformal layer of boron-doped silicate glass 300. In FIG. 4B, the unfilled part of the trench frame 218 is filled with boron-doped polysilicon 302, $SiO_2$ or a combination of boron-doped polysilicon and $SiO_2$.

Figure 5A:
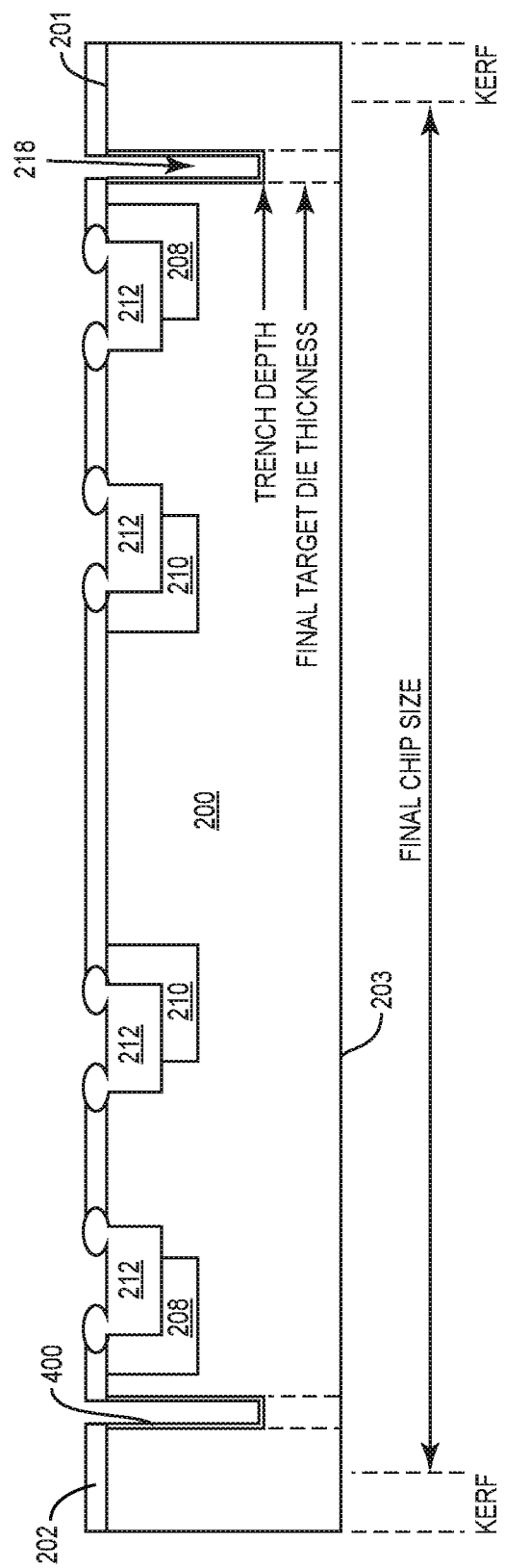
Figure 5B:
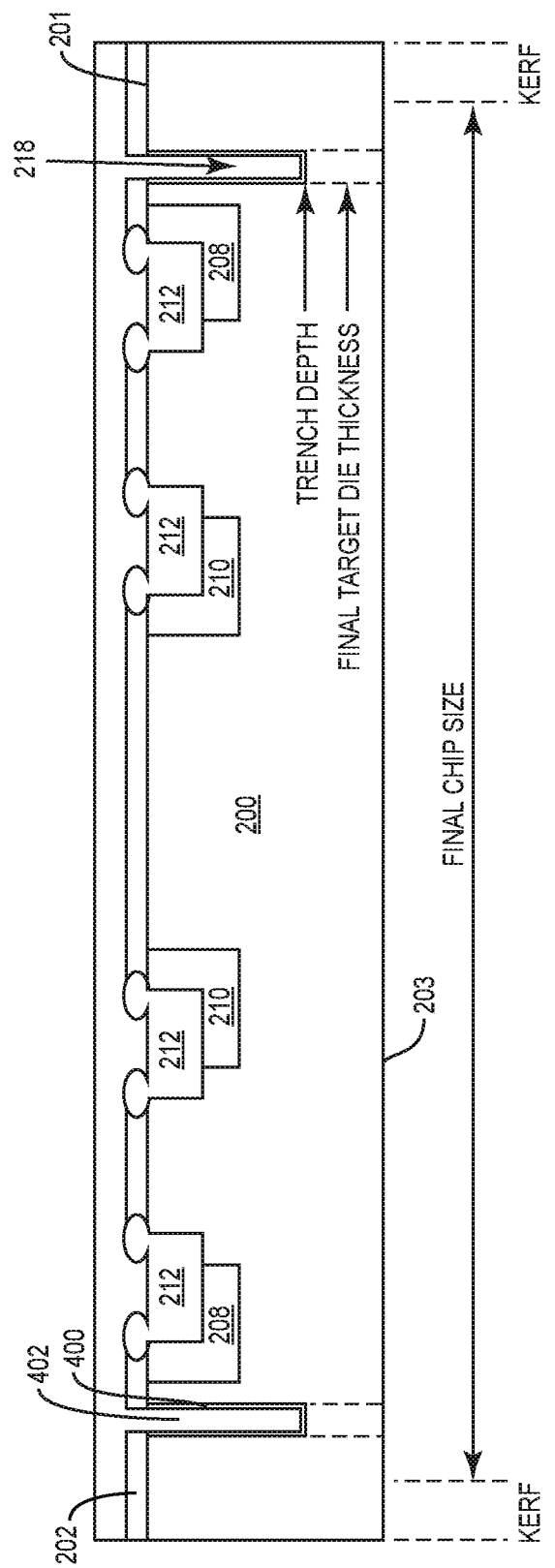

FIGS. 5A and 5B illustrate another alternate embodiment to the process step illustrated in FIG. 3H. In FIG. 5A, an oxide liner 400 such as $SiO_2$ is formed on the sidewalls and bottom of the trench frame 218. In FIG. 5B, a p-type dopant source 402 is deposited in the trench frame 218 after the sidewalls and bottom are covered with the oxide liner 400. The p-type dopant source 402 can be just a conformal layer of boron-doped silicate glass, just boron-doped polysilicon, or a combination of a conformal layer of boron-doped silicate glass and boron-doped polysilicon. In each case, p-type dopants out-diffuse from the p-type dopant source 402 through the oxide liner 402 and into the surrounding semiconductor material to form a continuous p-type doped region in the periphery region of each IGBT die as previously described herein in connection with FIG. 3I.

Figure 6:
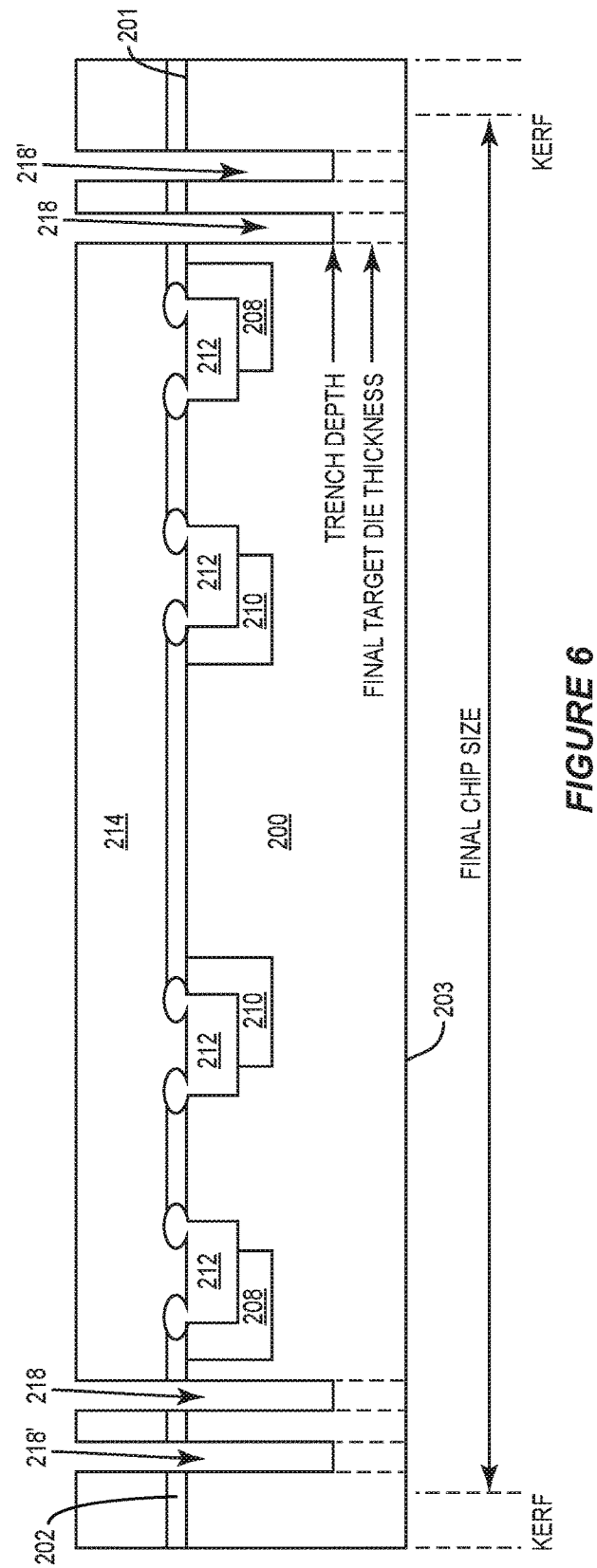

FIG. 6 illustrate an alternate embodiment to the process step illustrated in FIG. 3F. In FIG. 3F, a single trench frame 218 is etched in the periphery region of each IGBT die. In FIG. 6, at least two trench frames 218, 218' are etched in the periphery region between the reverse-blocking edge termination structure 208 and the kerf region. Each trench frames 218, 218' is filled with a p-type dopant source which is out-diffused into the surrounding semiconductor material as previously described herein. Adjacent ones of the trench frames 218, 218' are separated laterally by a region of semiconductor material which is narrow enough to be adequately doped by the out-diffused dopants from the p-type dopant source in each trench frame 218, 218'. For example, the lateral spacing of adjacent trench frames 218, 218' can be selected so that the semiconductor material separating the trench frames 218, 218' has a doping concentration of at least 1E16 cm$^{-3}$, at least 1E17 cm$^{3}$ or even higher after the out-diffusion process. Each trench frame 218, 218' can have the construction illustrated in FIG. 2A, 2B or 2C.

Figure 7:
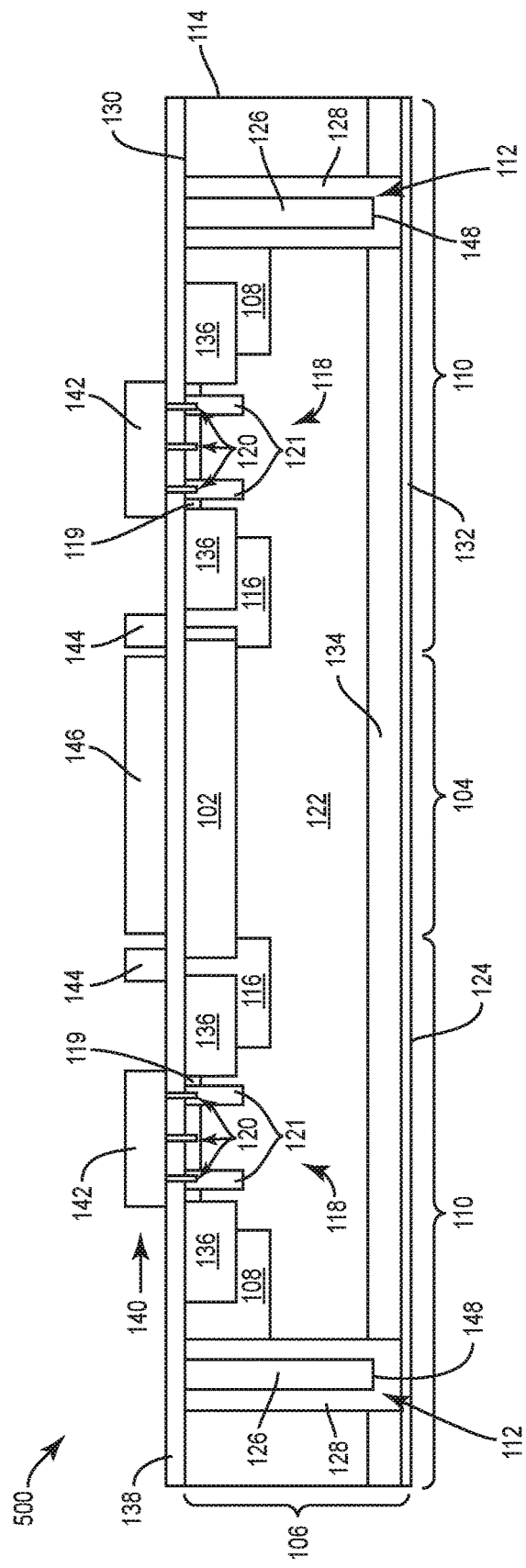
FIG. 7 illustrates a sectional view of a semiconductor die that includes a reverse-blocking IGBT having a trench frame in the periphery of the die filled with a p-type dopant source, according to another embodiment.

FIG. 7 illustrates a sectional view of another embodiment of a semiconductor die 500 including a reverse-blocking IGBT. The embodiment shown in FIG. 7 is similar to the embodiment shown in FIG. 1. Different, however, is that each trench frame 112 formed in the periphery region 110 of the IGBT die 500 is etched at least to a depth that corresponds to the final target thickness of the IGBT die 500 prior to thinning of the semiconductor substrate 106 on which the die 500 is fabricated. This way, the trench frame 112 extends to the bottom surface 124 of the semiconductor substrate 106 after thinning at the bottom surface 124. Any of the trench frame structures illustrated in FIGS. 2A through 2C can be used, and one or more trench frames 112 can be formed as previously described herein. Each trench frame 112 is filled with a p-type dopant source 126 also as previously described herein.

The embodiments previously described herein yield an IGBT device having a spatially uniform, high level, p-type doping region connecting the die backside to the die frontside, and distributed along a trench frame in the die periphery which surrounds the entire die. Approximately uniform doping can be achieved over both the die thickness and along the die surface. The highly p-doped region is centered on one or more deep trench frames and filled with a p-type dopant source. The trench frame can be etched to a depth lower than the final die thickness, but instead may terminate short of the final die thickness prior to substrate thinning. In either case, the trench frame is outside the channel stopper trench but inside the dicing area in the kerf region. The highly doped p-type area is electrically connected to the backside emitter by doping overlap and, via a system of contact holes, to the channel stopper metallization at the front-side.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A reverse-blocking IGBT (insulated gate bipolar transistor), comprising:
    a plurality of IGBT cells disposed in a device region of a semiconductor substrate;
    a reverse-blocking edge termination structure disposed in a periphery region of the semiconductor substrate which surrounds the device region;
    one or more trenches formed in the periphery region between the reverse-blocking edge termination structure and an edge face of the semiconductor substrate;
    a p-type dopant source at least partly filling the one or more trenches; and
    a continuous p-type doped region disposed in the periphery region and formed from p-type dopants out-diffused from the p-type dopant source, the continuous p-type doped region extending from a top surface of the semiconductor substrate to a bottom surface of the semiconductor substrate.

2. The reverse-blocking IGBT of claim 1, further comprising:
    a p-type collector disposed at the bottom surface of the semiconductor substrate,
    wherein the reverse-blocking edge termination structure is disposed at the top surface of the semiconductor substrate,
    wherein the continuous p-type doped region in the periphery region connects the p-type collector at the bottom surface of the semiconductor substrate to the reverse-blocking edge termination structure at the top surface of the semiconductor substrate.

3. The reverse-blocking IGBT of claim 2, further comprising:
    an n-type field stop region disposed in the semiconductor substrate above the p-type collector and below the reverse-blocking edge termination structure, the n-type field stop region extending laterally from the device region into the periphery region,
    wherein the continuous p-type doped region in the periphery region extends vertically through the n-type field stop region uninterrupted.

4. The reverse-blocking IGBT of claim 1, further comprising:
    a forward-blocking edge termination structure disposed in the periphery region between the reverse-blocking edge termination structure and the device region,
    wherein the continuous p-type doped region in the periphery region is isolated from the forward-blocking edge termination structure.

5. The reverse-blocking IGBT of claim 4, further comprising:
    a channel stopper region disposed in the periphery region between the reverse-blocking edge termination structure and the forward-blocking edge termination structure, wherein the channel stopper region is electrically connected to a drift zone potential of the reverse-blocking IGBT.

6. The reverse-blocking IGBT of claim 1, wherein the one or more trenches extend completely through the periphery region to the bottom surface of the semiconductor substrate.

7. The reverse-blocking IGBT of claim 1, wherein the p-type dopant source comprises a conformal layer of boron-doped silicate glass disposed along sidewalls and a bottom of the one or more trenches.

8. The reverse-blocking IGBT of claim 7, further comprising an oxide liner disposed on the sidewalls and bottom of the one or more trenches prior and separating the conformal layer of boron-doped silicate glass from semiconductor material surrounding the one or more trenches.

9. The reverse-blocking IGBT of claim 1, wherein the p-type dopant source comprises a conformal layer of boron-doped silicate glass disposed along sidewalls and a bottom of the one or more trenches and boron-doped polysilicon occupying space in the one or more trenches unoccupied by the conformal layer of boron-doped silicate glass.

10. The reverse-blocking IGBT of claim 1, further comprising:
a p-type collector disposed at the bottom surface of the semiconductor substrate; and
an n-type field stop region disposed in the semiconductor substrate above the p-type collector and below the reverse-blocking edge termination structure,
wherein the n-type field stop region extends laterally from the device region into the periphery region of the semiconductor substrate,
wherein the continuous p-type doped region in the periphery region extends vertically through the n-type field stop region uninterrupted.

11. The reverse-blocking IGBT of claim 1, wherein the one or more trenches are filled only with boron-doped polysilicon or only with boron-doped silicate glass as the p-type dopant source.

12. The reverse-blocking IGBT of claim 1, wherein the one or more trenches comprises a single trench which surrounds the device region.

13. The reverse-blocking IGBT of claim 1, wherein the one or more trenches comprises a plurality of trenches in the periphery region between the reverse-blocking edge termination structure and the edge face of the semiconductor substrate, wherein adjacent ones of the plurality of trenches are separated by a region of semiconductor material, and wherein the continuous p-type doped region in the periphery region extends into the region of semiconductor material between adjacent ones of the plurality of trenches.

14. The reverse-blocking IGBT of claim 13, wherein the plurality of trenches is arranged in a staggered manner.

* * * * *